United States Patent [19]

Dikken

[11] Patent Number: 4,973,861

[45] Date of Patent: Nov. 27, 1990

[54] INTEGRATED CIRCUIT COMPRISING LOGIC CIRCUITS AND AT LEAST ONE PUSH-PULL STAGE

[75] Inventor: Jan Dikken, Eindhoven, Netherlands

[73] Assignee: U. S. Philips Corporation, New York, N.Y.

[21] Appl. No.: 295,718

[22] Filed: Jan. 10, 1989

[30] Foreign Application Priority Data

Feb. 1, 1988 [NL] Netherlands ............... 8800234

[51] Int. Cl.⁵ .................................. H03K 19/003
[52] U.S. Cl. .............................. 307/443; 307/448; 307/451
[58] Field of Search ............... 307/246, 448, 451, 542, 307/544, 547–548, 584–585, 270, 443, 482, 578, 263

[56] References Cited

U.S. PATENT DOCUMENTS

| 4,612,466 | 9/1986 | Stewart | 307/585 |
| 4,638,187 | 1/1987 | Baier et al. | 307/451 |
| 4,677,317 | 6/1987 | Sakuma | 307/443 |
| 4,785,203 | 11/1988 | Nakamura | 307/448 |
| 4,797,579 | 1/1989 | Lewis | 307/443 |
| 4,818,901 | 4/1989 | Young et al. | 307/451 |
| 4,827,159 | 5/1989 | Naganuma | 307/443 |
| 4,841,172 | 6/1989 | Veno et al. | 307/443 |
| 4,857,770 | 8/1989 | Partovi et al. | 307/451 |
| 4,880,997 | 11/1989 | Steele | 307/451 |

Primary Examiner—Stanley D. Miller
Assistant Examiner—T. Cunningham
Attorney, Agent, or Firm—Bernard Franzblau

[57] ABSTRACT

An integrated circuit comprising logic circuits and at least one push-pull stage. In order to reduce the magnitude of induction voltages on power supply lines of the circuit, caused by the current variations in the push-pull stage comprising a push transistor and a pull transistor, a first current through one transistor is kept substantially constant until after a most significant rise of a second current through the other transistor when the push-pull stage is switched. A push-pull stage produces lower induction voltages during switching can thus be realized without adversely affecting the switching speed.

26 Claims, 3 Drawing Sheets

INTEGRATED CIRCUIT COMPRISING LOGIC CIRCUITS AND AT LEAST ONE PUSH-PULL STAGE

BACKGROUND OF THE INVENTION

This invention relates to an integrated circuit, comprising logic circuits and at least one push-pull stage which comprises, connected in a first path between a first power supply line which carries a high supply voltage and a stage output, a current channel of a push transistor and, connected in a second path between the stage output and a second power supply line which carries a low supply voltage, a current channel of a pull transistor. Control means are provided which are connected to control electrodes of the push transistor and the pull transistor in order to generate, when a logic state of the stage changes, time-dependent control voltages in order to reduce voltage noise on the power supply lines which is caused by current variations at the stage output.

Such an IC comprising a push-pull stage is known from Netherlands Patent Application No. 8601558, which corresponds to U.S. Pat. No. 4,783,601 (11/8/88), and which is hereby incorporated by reference. The known push-pull stage comprises control means for generating time-dependent control voltages on the control electrodes of the push transistor and the pull transistor in order to reduce voltage noise on the internal power supply lines of the circuit. Due to variations of the load current which the push-pull stage supplies to an output load, induction voltages are generated across inductances present in the power supply lines. The control means control the currents through the push transistor and the pull transistor so that the currents are varied by a constant amount per unit of time during switching i.e. the currents vary linearly with time during switching. Consequently, the said load current, being the difference between these currents, is also varied by a constant amount per unit of time. When the load current is made to vary linearly in time, the maximum value of the interfering voltages induced thereby is limited and is constant.

SUMMARY OF THE INVENTION

It is an object of the invention to improve the known push-pull stage by reducing the induction voltages occurring on the power supply lines even further. To achieve this, an integrated circuit in accordance with the invention is characterized in that during the switching of the push-pull stage the control means keep a first current through one transistor of the stage substantially constant until a greatest rise has occurred in a second current through the other transistor of the stage. In the known push-pull stage the currents through the push transistor and the pull transistor change substantially simultaneously, one current increasing linearly in time by an amount which equals the amount by which the other current decreases. Because the load current is the difference between these two currents, the variation of the load current is cumulative. By keeping one current substantially constant until the other current variation has taken place substantially completely, the maximum value of the induction voltage generated is reduced without deterioration of the switching speed.

An embodiment of an integrated circuit in accordance with the invention, in which the control means comprise controllable charge paths and dicharge paths which are connected to the control electrodes of the push transistor and the pull transistor, is characterized in that in its conductive state the discharge path between the control electrode of the pull transistor and the second power supply line conducts a substantially smaller maximum current than the charge path between the first power supply line and the control electrode of the push transistor in the conductive state of said charge path. The push transistor is then fully conductive before a current through the pull transistor can vary substantially. This is due on the one hand to the rise of the drive voltage across the pull transistor and on the other hand to the decrease of the control voltage of the pull transistor.

A further embodiment of an integrated circuit in accordance with the invention is characterized in that the discharge path for the control electrode of the push transistor comprises a current channel of a discharge transistor, which current channel connects a node between the current channels of the push transistor and the pull transistor to the control electrode of the push transistor. Just before the push transistor turns off, a current through this transistor is substantially independent of a voltage across its current channel, which is referred to herein as the driving voltage. By thus connecting the control electrode of the push transistor, when this transistor is going to be cut-off, to a node between the current channels of the push transistor and the pull transistor via the discharge transistor, during which operation the pull transistor is made conductive, the push transistor initially continues to supply a substantially constant current. This situation changes only when the voltage at said node has dropped so far below the voltage on the control electrode of the discharge transistor that the latter transistor starts to discharge the input of the push transistor.

Another embodiment of a push-pull stage in accordance with the invention is characterized in that the control means comprise a control circuit which includes a switching transistor, a current channel of which is connected to the control electrode of the push transistor in series with the relevant charge path, which switching transistor forms an inverter circuit in conjunction with the discharge transistor. The control means comprise a second control circuit which includes a second inverter circuit which has an output connected to the control electrode of the pull transistor and which is formed by a second switching transistor, having a current channel connected between the control electrode of the pull transistor and the relevant charge path, and by a second discharge transistor having a current channel connected between the control electrode of the pull transistor and the second power supply line. The charge paths of the first and the second control circuit each comprise, connected to the first power supply line, a current channel of a respective cascode transistor, a control electrode of which is connected to the output of the respective inverter circuit, and also comprise, connected parallel to the current channel of the respective cascode transistor, a current channel of a respective further cascode transistor. An input of the first and the second inverter circuit, are connected, via a first and a second delay element, respectively, to a control electrode of the respective further cascode transistor. The further cascode transistor is made conductive after a delay. Initially, this cascode transistor does not influence the voltages in the inverter circuit which generates, as described in the prior art, a suitable control voltage which ensures a linear variation in time of the currents switched by the transistors of the push-pull stage. The further cascode transistor raises the output voltage of the inverter circuit to the voltage level of the first power supply line only after expiration of a given period of time. In comparison with the prior art, this is a better way of keeping the current variation in time substantially linear. According to the prior art, the further cascode transistor is rendered conductive without delay so that the said variation of the current in time in the push transistor, or the pull transistor, is influenced from the very beginning.

Another embodiment of a push-pull stage in accordance with the invention is characterized in that the discharge path between the control electrode of the pull transistor and the second power supply line comprises at least first and second parallel paths. The first parallel path can be switched off in response to on a control signal to be applied to the control means while the second parallel path can be switched off in response to a voltage at a gate first and second output of a logic gate, gate inputs of which are connected to the control electrode of the pull transistor and to the push-pull stage output, respectively. For example, in the case of an extremely large capacitive load on the stage output the pull transistor could be cut-off prematurely, thus causing large current variations and hence high induction voltages. By switching off a part of the discharge path in these circumstances, a more gradual current variation through the pull transistor is achieved.

BRIEF DESCRIPTION OF THE DRAWING

The invention will be described in detail hereinafter with reference to the accompanying drawing; in which.

DESCRIPTION OF THE PREFERRED EMBODIMENTS

Figure 1:
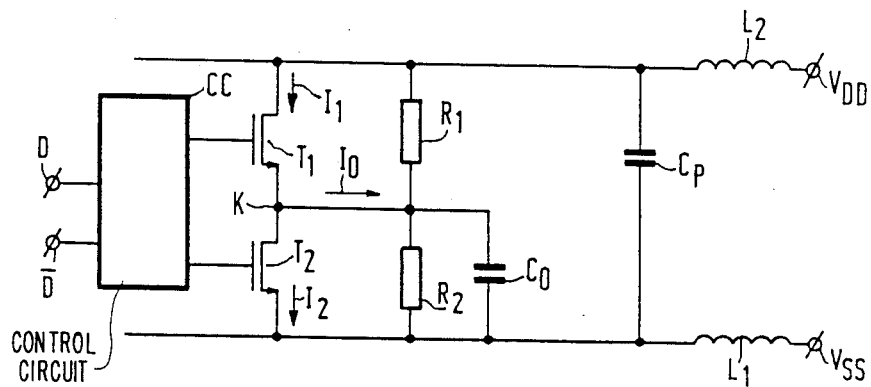
FIG. 1 shows a circuit diagram of a push-pull stage.

FIG. 1 shows a circuit diagram of a push-pull stage. The stage comprises a cascode connection of a push transistor $T_1$ and a pull transistor $T_2$ between power supply lines carrying the supply voltages $V_{DD}$ and $V_{SS}$. The output K of the stage is loaded by, for example, a TTL circuit which is represented in the Figure by resistances $R_1$ and $R_2$, connected in series between the power supply lines, and a capacitance $C_0$ which is connected parallel to the resistance $R_2$. The stage also comprises a control circuit CC, inputs of which receive logic signals D and D̄. The transistors $T_1$ and $T_2$ are controlled by means of mutually logically complementary control signals. The load current $I_0$ at all times equals the difference between the current $I_1$ conducted by the transistor $T_1$ and the current $I_2$ conducted by the transistor $T_2$. For example, when the push transistor $T_1$ is made conductive and the pull transistor $T_2$ is blocked substantially simultaneously, the variation of the current $I_1$ per unit of time amounts to: $dI_1/dt$, positive, and the variation of the current $I_2$ per unit of time is: $dI_2/dt$, negative. The variation of the load current $I_0$ per unit of time ($dI_0/dt$) equals the sum of the absolute values of the variations in $I_1$ and $I_2$:

$$dI_0/dt = |dI_1/dt| + |dI_2/dt|.$$

On the internal power supply lines, which inevitably include parasitic inductances $L_1$ and $L_2$ coupled via a parasitic capacitance $C_p$, this current variation $dI_0/dt$ causes a high induction voltage giving rise to interference, for example, in the logic state of other parts of an integrated circuit in which the push-pull stage is included.

Figure 2A:
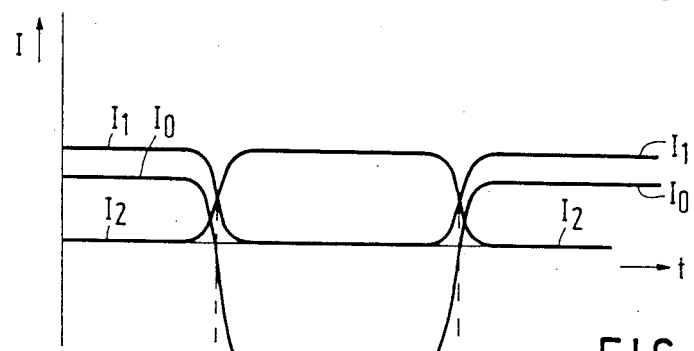
FIGS. 2A and 2B illustrate a current variation in a push-pull stage according to the state of the art.
Figure 2B:
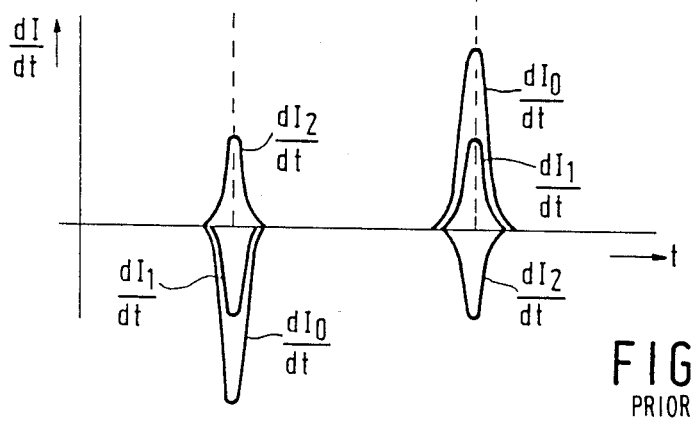

FIGS. 2A and 2B illustrate the variation in time of the currents $I_1$ and $I_2$ and the load current $I_0$, and their time derivatives, for a circuit according to the present state of the art. When the most significant variations in the currents $I_1$ and $I_2$ coincide substantially in time, the variation $dI_0/dt$ generates a maximum induction voltage equal to the sum of the absolute extreme values of $dI_1/dt$ and $dI_2/dt$.

Figure 3A:
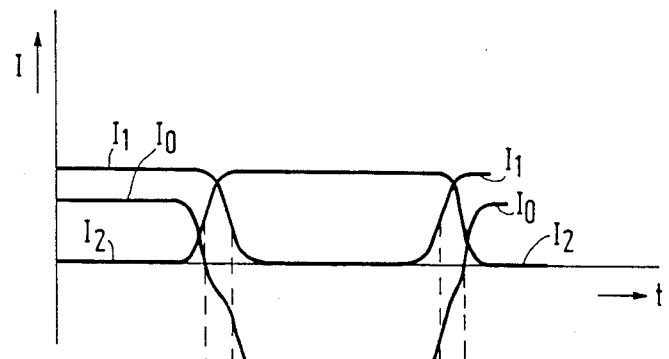
FIGS. 3A and 3B show a current variation in a push-pull stage in an integrated circuit in accordance with the invention.
Figure 3B:
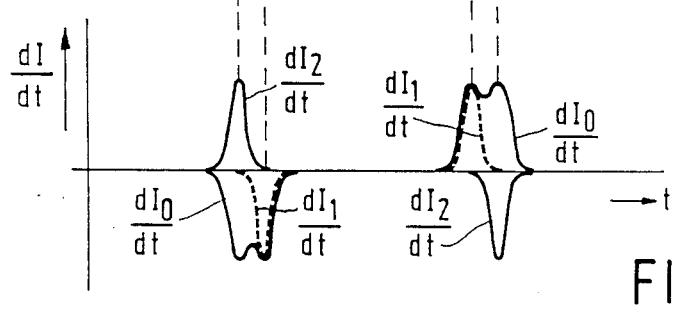

FIGS. 3A and 3B illustrate the variation in time of the currents $I_1$ and $I_2$ and the load current $I_0$, and their time derivatives, for a circuit in accordance with the invention. Because the extreme values of $dI_1/dt$ and $dI_2/dt$ have been shifted in time with respect to one another, the maximum induction voltage $dI_0/dt$ is substantially a factor 2 times smaller than in the case illustrated with reference to FIGS. 2A and 2B.

Figure 4:
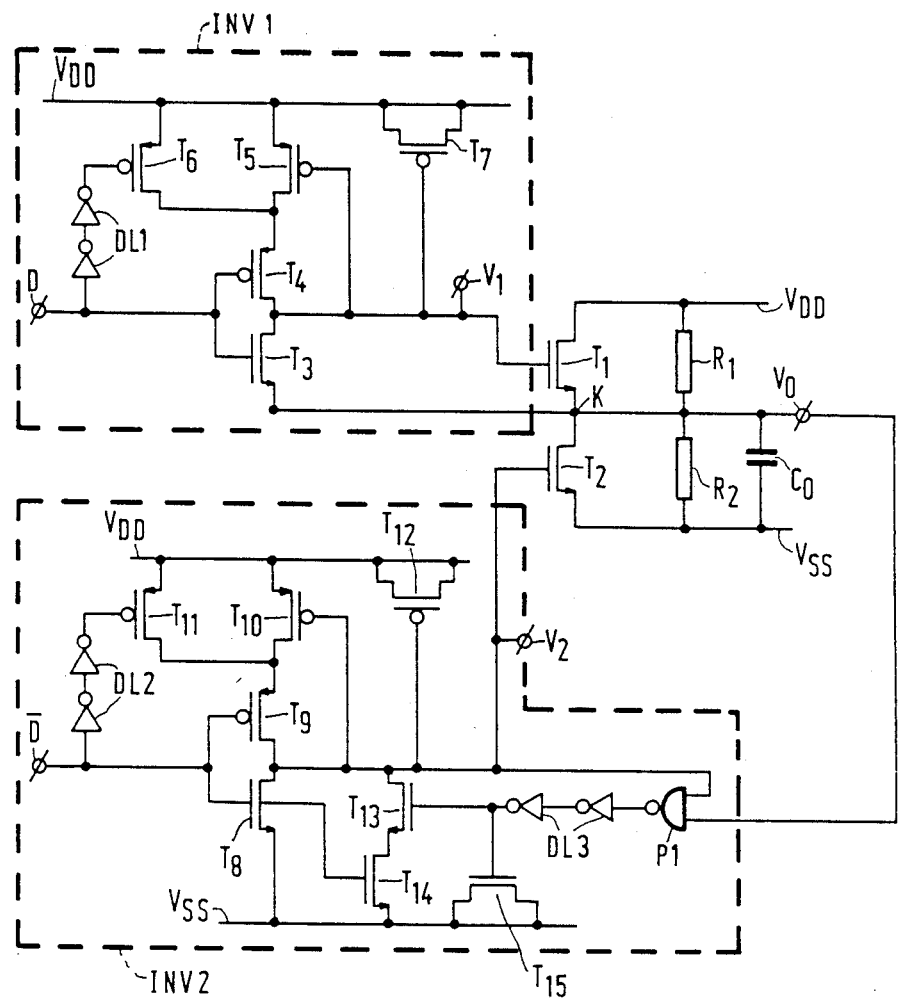
FIG. 4 shows a preferred embodiment of a push-pull stage in an integrated circuit in accordance with the invention.

FIG. 4 shows a preferred embodiment of a push-pull stage in accordance with the invention. A TTL load, represented by resistances $R_1$, $R_2$ and a capacitance $C_0$, is connected to output terminal K of the stage which comprises a push transistor $T_1$ and a pull transistor $T_2$. The push transistor $T_1$ receives a control signal $V_1$ from a first control circuit INV1 and the pull transistor $T_2$ receives a control signal $V_2$ from a second control circuit INV2. Each of the control circuits INV1 and INV2 comprise a controllable discharge path which is formed by a transistor $T_3$ and a transistor $T_8$, respectively. The function of the transistor $T_3$, which is connected between the control electrode of the push transistor $T_1$ and the output terminal K, will be described with reference to FIG. 5. The charge paths of the control circuits INV1 and INV2 comprise transistors $T_4$ to $T_7$ and $T_9$ to $T_{12}$, respectively. Because the charge paths have the same construction, only that of the control circuit INV1 will be described hereinafter. A similar explanation applies to the charge path in the control circuit INV2. Therefore, when reference is made to a component of the control circuit INV1, a reference to a corresponding component of the control circuit INV2 is stated between parentheses. The transistor $T_4$ ($T_9$) serves as a switch for the transistor $T_5$ ($T_{10}$) which is connected as a current source and which has a control electrode connected to the control electrode of the push transistor $T_1$ (pull transistor $T_2$). Using this set-up, a time-dependent control signal $V_1$ ($V_2$) is formed such that, when the push transistor $T_1$ (pull transistor $T_2$) is activated, the current therethrough increases approximately linearly in time. This linear time dependency limits the maximum value of the interference voltages induced by the current variations in the push-pull stage. Because $T_5$ ($T_{10}$) is cut off further as the control voltage $V_1$ ($V_2$) increases, there is provided a parallel transistor $T_6$ ($T_{11}$) which raises the control voltage $V_1$ ($V_2$) to the supply voltage $V_{DD}$ after a retardation via the delay element DL1 (DL2). Due to the delayed switching-on of the parallel transistor, it initially has no effect on the control voltage variation realized by the transistor $T_5$ ($T_{10}$). In order to improve the control voltage variation of $V_1$ ($V_2$) for a current which varies linearly in time in the push transistor $T_1$ (pull transistor $T_2$) when the control voltage $V_1$ ($V_2$) approaches the supply voltage $V_{DD}$, there is provided a non-linear capacitance which is realized by means of the transistor $T_7$ ($T_{12}$). Because this capacitance decreases strongly as the control voltage $V_1$ ($V_2$) increases beyond a voltage equal to $V_{DD}$ minus a threshold, an excessively low charge current via the transistors $T_5$ and $T_6$ ($T_{10}$ and $T_{11}$) to the control electrode of the pull transistor $T_1$ (pull transistor $T_2$) is compensated for in said control voltage interval. In order to enable the current through the pull transistor $T_2$ to be kept substantially constant when the push transistor $T_1$ is turned on, the discharge path for the control electrode of the pull transistor $T_2$, comprising the transistors $T_8$, $T_{13}$ and $T_{14}$, is proportioned with respect to the charge path for the control electrode of the push transistor $T_1$, comprising the transistors $T_4$, $T_5$ and $T_6$, in such a way that the maximum discharge current through the aforesaid discharge path is a factor from 1.5 to 10 times smaller than the maximum charge current through the charge path. For a W/L ratio of 535/1.3 for the push transistor $T_1$ and of 531/1.3 for the pull transistor $T_2$, it has been found that the following W/L ratios suffice:

—$T_4$:80/1.3—$T_5$:30/1.3—$T_6$:40/1.3

—$T_8$:2/1.3—$T_{10}$:14/1.3—$T_{14}$:14/1.3.

It is thus achieved that the push transistor $T_1$ is already fully conductive before a current through the pull transistor $T_2$ changes substantially. The pull transistor $T_2$ then operates in the linear range. The decrease of the control voltage on the control electrode of $T_2$ and the increase of the driving voltage across the current channel of $T_2$ oppose one another in as far as the current variation is concerned. The discharge path in INV2 comprises a first path consisting of transistor $T_8$ and a second path consisting of transistors $T_{13}$ and $T_{14}$. The transistors $T_8$ and $T_{14}$ receive the same control signal, the transistor $T_{13}$ receiving a signal from a logic NAND gate $P_1$. The gate $P_1$ is fed on the one hand by the control signal for the pull transistor $T_2$ ($V_2$) and on the other hand by the output voltage $V_0$ at the terminal K. For example, if the load capacitance $C_0$ or the load resistance $R_1$ were very high, the switching off of the pull transistor $T_2$ would be too fast when the discharge path is fully conductive, thus causing an excessively large current variation and hence an excessively high induction voltage. This can be avoided by temporairly switching off a part of the discharge path. When the control signal $V_2$ is high and the output voltage $V_0$ still has a level above a predetermined value, the transistor $T_{13}$ is blocked via the NAND-gate $P_1$. The instant of switching on or off of the transistor $T_{13}$ depends inter alia on the transition point of the gate $P_1$, the dimensions of the transistors forming the gate, and on a delay element DL3, if any, between the gate output of the gate $P_1$ and the control electrode of the transistor $T_{13}$. The capacitance $T_{15}$ serves to achieve gradual switching of the transistor $T_{13}$.

Figure 5:
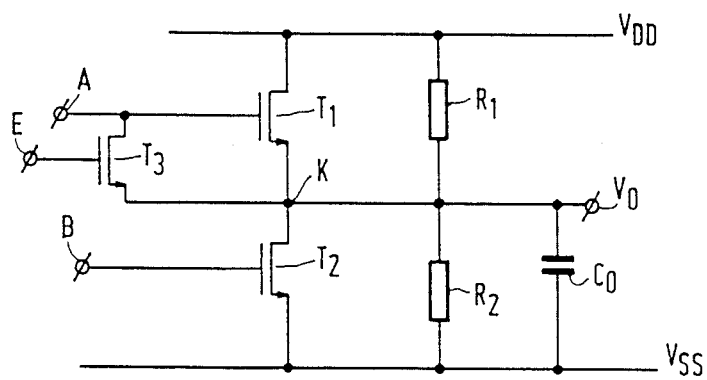
FIG. 5 shows a detail of the push-pull stage in the integrated circuit shown in FIG. 4.

FIG. 5 shows a detail of the push-pull stage shown in FIG. 4. The push transistor $T_1$ and the pull transistor $T_2$ are shown, and also the TTL load which is represented by the resistances $R_1$, $R_2$ and the capacitance $C_0$, which load is connected to the output terminal K. Terminals A and B are connected to further parts of the control circuit (not shown). Between the control electrode of the push transistor $T_1$ and the output terminal K there is formed a discharge path which includes a discharge transistor $T_3$. Just before the instant of switching off, the push transistor $T_1$ operates in the saturated state. The current conducted is thus independent of a driving voltage across the current channel. The output voltage $V_0$ on the output terminal K is then high. The switching off of the push transistor $T_1$ is preceded by the switching on of the pull transistor $T_2$, the uncoupling of the terminal A from the remainder of the control circuit, and the activation of the further transistor $T_3$ by means of a high voltage. Via the terminal E the further transistor $T_3$ is driven to full output when the push transistor $T_1$ is switched off. Because the output voltage $V_0$ is still high at that instant, the further transistor $T_3$ will operate beyond or near its threshold voltage, which implies that the control electrode of the push transistor $T_1$ is not discharged or only partly so. During the decrease of the output voltage $V_0$, the push transistor $T_1$ remains saturated and delivers a constant current. It is only when the output voltage $V_0$ has decreased sufficiently far that the further transistor $T_3$ starts to conduct that the control electrode of the push transistor $T_1$ is discharged further.

What is claimed is:

1. An integrated logic circuit comprising: at least one push-pull stage which comprises, a first path connected between a first power supply line which carries a high supply voltage and a stage output, wherein said first path includes a current channel of a push transistor; a second path connected between the stage output and a second power supply line which carries a low supply voltage, wherein said second path includes a current channel of a pull transistor; and control means connected to control electrodes of the push transistor and the pull transistor in order to generate, when a logic state of the push-pull stage changes, time-dependent control voltages in order to reduce voltage noise on the power supply lines which is caused by current variations at the stage output, characterized in that during the switching of the push-pull stage the control means keep a first current through one transistor of the push-pull stage substantially constant until a rise in a second current through the other transistor of the stage is substantially complete.

2. An integrated circuit as claimed in claim 1 wherein the control means comprise first and second controllable charge paths and first and second controllable discharge paths with the first charge and discharge path connected to the control electrode of the push transistor and the second charge and discharge path connected to the pull transistor control electrode, characterized in that the second discharge path is coupled between the control electrode of the pull transistor and the second power supply line and said second discharge path conducts a substantially smaller maximum current than flows in the first charge path which is coupled between the first power supply line and the control electrode of the push transistor.

3. An integrated circuit as claimed in claim 2, wherein said maximum currents deviate from one another by a factor of from 1.5 to 10.

4. An integrated circuit as claimed in claim 2, wherein the first discharge path comprises a current channel of a discharge transistor, and said current channel couples the stage output to the control electrode of the push transistor.

5. An integrated circuit as claimed in claim 4, wherein the control means further comprises a first control circuit which includes a switching transistor having a current channel connected to the control electrode of the push transistor as part of the first charge path, said switching transistor forming an inverter circuit with the discharge transistor.

6. An integrated circuit as claimed in claim 5, wherein the control means further comprises a second control circuit which includes a second inverter circuit which has an output connected to the control electrode of the pull transistor and which includes a second switching transistor having a current channel connected in the second charge path, and further includes a second discharge transistor having a current channel connected between the control electrode of the pull transistor and the second power supply line, the charge paths of the first and the second control circuits each comprising, connected to the first power supply line, a current channel of a respective cascode transistor, a control electrode of which is connected to the output of the respective inverter circuit, and, connected parallel to the current channel of the respective cascode transistor, a current channel of a respective further cascode transistor, and means coupling respective inputs of the first and the second inverter circuits, via a first and a second delay element, respectively, to a respective control electrode of the respective further cascode transistor.

7. An integrated circuit as claimed in claim 2, wherein the discharge path between the control electrode of the pull transistor and the second power supply line comprises at least first and second parallel paths, wherein the first parallel path can be switched off in response to a control signal to be applied to the control means while the second parallel path can be switched off in response to a voltage at an output of a logic gate having first and second gate inputs which are connected to the control electrode of the pull transistor and to the output of the push-pull stage, respectively.

8. An integrated circuit as claimed in claim 7, wherein a delay element is connected between the gate output and a control electrode of a transistor having a current channel connected in the second parallel path.

9. An integrated circuit as claimed in claim 8, wherein the control electrode of the transistor having a current channel connected in the second parallel path, is coupled to the second power supply line via a capacitance.

10. An integrated circuit as claimed in claim 3, wherein the first discharge path comprises a current channel of a discharge transistor, and said current channel coupled the stage out between the current channels of the push transistor and the pull transistor to the control electrode of the push transistor.

11. An integrate circuit as claimed in claim 10, wherein the control means further comprises a control circuit which includes a switching transistor having a current channel connected to the control electrode of the push transistor as part of the first charge path, said switching transistor forming an inverter circuit with the discharge transistor.

12. An integrated circuit as claimed in claim 3, wherein the second discharge path comprises at least first and second parallel paths, wherein the first parallel path can be switched off in response to a control signal to be applied to the control means while the second parallel path can be switched off in response to a voltage at an output of a logic gate having first and second gate inputs connected to the control electrode of the pull transistor and to the push-pull stage output, respectively.

13. An integrated circuit as claimed in claim 12, wherein a delay element is connected between the gate output and a control electrode of a transistor having a current channel connected in the second parallel path.

14. An integrated logic circuit comprising:
a push-pull stage including first and second transistors connected in series between first and second supply voltage terminals and with a common node therebetween coupled to an output terminal for connection of a load, and
control means having first and second outputs coupled to respective control electrodes of the first and second transistors to supply thereto first and second time-dependent control voltages that turn on one of the first and second transistors and turn off another of the first and second transistors, and vice versa, thereby to produce a variation in the currents $I_1$ and $I_2$ that flow in said first and second transistors, respectively, said control means including means for supplying said first and second control voltages with a time delay therebetween such that a maximum value of $dI_1/dt$ is shifted in time with respect to a maximum value of $dI_2/dt$ during switching of the first and second transistors.

15. An integrated logic circuit as claimed in claim 14 wherein said control means includes a third transistor connected between the control electrode of the first transistor and said common node, said third transistor having a control electrode by which said third transistor is turned full on when said first transistor is turned off.

16. An integrated logic circuit as claimed in claim 14 wherein said control means further comprises,
a first controllable charge path and a first controllable discharge path coupled to the control electrode of the first transistor,
a second controllable charge path and a second controllable discharge path connected to the control electrode of the second transistor, and wherein said second discharge path conducts a smaller current than said first charge path.

17. An integrated logic circuit as claimed in claim 14 wherein said control means further comprises,
a first controllable charge path and a first controllable discharge path coupled to the control electrode of the first transistor, said first controllable charge path comprising a first switching transistor and a third transistor connected in a first series circuit between said first supply voltage terminal and said first output of the control means and with a control electrode of the third transistor connected to the first output of the control means and a control electrode of the first switching transistor coupled to a first input terminal for supplying a switching signal to the logic circuit, said first controllable discharge path including a fourth transistor connected between said first output of the control means and said common node and with a control electrode coupled to said first input terminal,
a second controllable charge path and a second controllable discharge path connected to the control electrode of the second transistor, said second controllable charge path comprising a second switching transistor and a fifth transistor connected in a second series circuit between said first supply voltage terminal and said second output of the control means and with a control electrode of the fifth transistor connected to the second output of the control means and a control electrode of the second switching transistor coupled to a second input terminal for supplying a switching signal to the logic circuit, said second controllable discharge path including a sixth transistor connected between said second output of the control means and said second supply voltage terminal and with a control electrode coupled to said second input terminal.

18. An integrated logic circuit as claimed in claim 17, wherein said control means further comprises,
a seventh transistor coupled in parallel with said third transistor and with its control electrode coupled via a first delay element to said first input terminal, and
an eighth transistor coupled in parallel with said fifth transistor and with its control electrode coupled via a second delay element to said second input terminal.

19. An integrated logic circuit as claimed in claim 14 wherein said control means further comprises,
a first controllable charge path and a first controllable discharge path coupled to the control electrode of the first transistor,
a second controllable charge path and a second controllable discharge path connected to the control electrode of the second transistor, said second controllable discharge path comprising third and fourth transistors connected in parallel between said second output of the control means and said second supply voltage terminal, a control electrode of one of said third and fourth transistors being jointly controlled by the second control voltage and by an output voltage at said common node.

20. An integrated logic circuit as claimed in claim 14 wherein said first and second control voltages are complementary to one another.

21. An integrated logic circuit comprising:
first and second transistors connected in series between first and second supply voltage terminals and with a common node therebetween coupled to an output terminal for connection to a load, and
control means having first and second outputs coupled to respective control electrodes of the first and second transistors to supply thereto first and second time-dependent control voltages that turn on one of the first and second transistors and turn off another of the first and second transistors, and vice versa, and with a time delay therebetween such that during switching of the transistors the off transistor is switched on before the on transistor is switched off and in a manner such that current flow in the on transistor remains substantially constant until a substantial current flows in the other transistor, whereafter the current in the on transistor is rapidly turned off.

22. An integrated logic circuit as claimed in claim 21 wherein,
said control means includes a third transistor connected between the control electrode of the first transistor and said common node, said third transistor having a control electrode connected to a logic input terminal of the circuit, and wherein
during switching said control means initially supply non-linear first and second control voltages to said respective control electrodes of the first and second transistors such that switching currents that flow in said first and second transistors vary linearly in time during at least a part of the switching period.

23. An integrated logic circuit as claimed in claim 22 further comprising a switching transistor and a fourth transistor connected in a series circuit between said first supply voltage terminal and said first output of the control means and with a control electrode of the fourth transistor connected to the first output of the control means and a control electrode of the switching transistor coupled to said logic input terminal.

24. An integrated logic circuit as claimed in claim 23 wherein said control means further comprises,
a fifth transistor coupled in parallel with said fourth transistor and having a control electrode coupled via a delay element to said logic input terminal.

25. An integrated logic circuit as claimed in claim 24 wherein said control means further comprises,
a second logic input terminal for the circuit,
a sixth transistor connected between the control electrode of the second transistor and the second supply voltage terminal and with a control electrode coupled to said second logic input terminal,
a second switching transistor and a seventh transistor connected in a second series circuit between said first supply voltage terminal and said second output of the control means and with a control electrode of the seventh transistor connected to said second output and a control electrode of the second switching transistor coupled to said second logic input terminal, and
an eighth transistor coupled in parallel with said seventh transistor and having a control electrode coupled via a second delay element to said second logic input terminal.

26. An integrated logic circuit as claimed in claim 25 wherein said control means further comprises,
a ninth transistor coupled in a path parallel to said second transistor and having a control electrode controlled by a voltage at said output terminal and by a voltage at said sixth output of the control means.

* * * * *